(12) United States Patent
Kawamoto

(10) Patent No.: US 8,598,023 B2
(45) Date of Patent: Dec. 3, 2013

(54) SUBSTRATE PROCESSING APPARATUS, SUBSTRATE PROCESSING METHOD, AND METHOD OF MANUFACTURING SEMICONDUCTOR DEVICE

(75) Inventor: Tomokazu Kawamoto, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/562,741

(22) Filed: Jul. 31, 2012

(65) Prior Publication Data

US 2012/0295429 A1 Nov. 22, 2012

Related U.S. Application Data

(62) Division of application No. 13/076,861, filed on Mar. 31, 2011, now Pat. No. 8,393,091, which is a division of application No. 12/034,975, filed on Feb. 21, 2008, now abandoned.

(30) Foreign Application Priority Data

Feb. 21, 2007 (JP) .................................. 2007-040322

(51) Int. Cl.
*H01L 21/425* (2006.01)

(52) U.S. Cl.
USPC ........... 438/524; 438/906; 438/502; 438/509; 438/514; 257/E21.346; 34/463

(58) Field of Classification Search
USPC .................. 438/524, 906, 502, 509, 514; 257/E21.346; 34/463
See application file for complete search history.

(56) References Cited

U.S. PATENT DOCUMENTS

| | | |
|---|---|---|
| 5,608,974 A | 3/1997 | Tanaka et al. |
| 5,671,544 A | 9/1997 | Yokomizo et al. |
| 5,709,037 A | 1/1998 | Tanaka et al. |
| 5,950,328 A | 9/1999 | Ichiko et al. |
| 6,029,371 A | 2/2000 | Kamikawa et al. |
| 6,032,382 A | 3/2000 | Matsumoto et al. |
| 6,093,654 A | 7/2000 | Koyama |
| 6,134,807 A | 10/2000 | Komino et al. |
| 6,158,141 A | 12/2000 | Asada et al. |
| 7,581,335 B2 | 9/2009 | Tanaka et al. |
| 2005/0139926 A1 | 6/2005 | Shimizu et al. |

FOREIGN PATENT DOCUMENTS

| | | |
|---|---|---|
| JP | 64-69015 | 3/1989 |
| JP | 10-64908 | 3/1998 |
| JP | 10-116813 | 5/1998 |
| JP | 11-354485 | 12/1999 |
| JP | 2002-367952 | 12/2002 |

(Continued)

OTHER PUBLICATIONS

USPTO, [Gavini] Notice of Allowance and Fees Due, Nov. 20, 2012, in parent U.S. Appl. No. 13/076,861 [allowed].

(Continued)

*Primary Examiner* — Timor Karimy
(74) *Attorney, Agent, or Firm* — Fujitsu Patent Center

(57) ABSTRACT

There is disclosed a substrate processing apparatus including a processing chamber housing a substrate, pipes for supplying gas into the processing chamber, and heaters provided in the middle of the pipes, and heating the gas. In the substrate processing apparatus, the heaters heat the gas to a temperature lower than a temperature at which exhaust gas is generated from the pipes to dry the substrate in the heated gas.

3 Claims, 13 Drawing Sheets

(56) References Cited

FOREIGN PATENT DOCUMENTS

| JP | 2003-273059 | 9/2003 |
|----|-------------|--------|
| JP | 2005-166958 | 6/2005 |
| KR | 1999-29868  | 4/1999 |

OTHER PUBLICATIONS

Korean Office Action dated Aug. 25, 2009, issued in corresponding Korean Patent Application No. 10-2008-0014295.

Japanese Office Action, Partial English-language Translation, mailed May 24, 2011 for corresponding Japanese Application No. 2007-040322.

Taiwanese Office Action dated Nov. 17, 2011 for corresponding Taiwanese Application No. 097105884.

USPTO, (Carrillo) Restriction Requirement, Oct. 19, 2011, in parent U.S. Appl. No. 13/076,861 [pending].

USPTO, (Carrillo) Non-Final Action, Dec. 19, 2011, in parent U.S. Appl. No. 13/076,861 [pending].

USPTO, (Carrillo) Final Action, Apr. 25, 2012, in parent U.S. Appl. No. 13/076,861 [pending].

USPTO, (Cormier) Final Rejection, Jan. 10, 2011, in parent U.S. Appl. No. 12/034,975 [abandoned].

USPTO, (Cormier) Non-Final Rejection, Aug. 2, 2010, in parent U.S. Appl. No. 12/034,975 [abandoned].

USPTO, (Cormier) Restriction Requirement, Jun. 4, 2010, in parent U.S. Appl. No. 12/034,975 [abandoned].

SUBSTRATE PROCESSING APPARATUS, SUBSTRATE PROCESSING METHOD, AND METHOD OF MANUFACTURING SEMICONDUCTOR DEVICE

CROSS-REFERENCE TO RELATED APPLICATIONS

The present application is a divisional of application Ser. No. 13/076,861, filed Mar. 31, 2001, which is a divisional of application Ser. No. 12/034,975, filed Feb. 21, 2008, which claims priority of Japanese Patent Application No. 2007-040322 filed on Feb. 21, 2007, the entire contents of which are incorporated herein by reference.

TECHNICAL FIELD

It is related to a substrate processing apparatus, a substrate processing method, and a method of manufacturing a semiconductor device.

BACKGROUND

In manufacturing processes for a semiconductor device such as a large-scale integrated circuit (LSI), various cleaning processes are performed for the purpose of removing organic materials and the like on a semiconductor substrate. The cleaning processes typically include the steps of dipping a semiconductor substrate into a chemical solution, washing the semiconductor substrate with deionized water, and then drying the semiconductor substrate.

In the drying step, a drying rate is accelerated by taking out the semiconductor substrate to an alcohol atmosphere and consequently replacing moisture on a surface of the substrate with alcohol.

The above-mentioned drying step is described in detail in Japanese Patent Application Laid-open Publication No. Hei 11-354485, for example.

According to Japanese Laid-open Patent Publication No. 11-354485, occurrence of dew condensation on a surface of a substrate is prevented by heating, in the drying step, the substrate to a higher temperature than the higher one of a water dew point and an alcohol dew point, so that attachment of particles to the substrate attributable to the dew condensation is prevented.

In addition, the techniques related to the present embodiments are also disclosed in Japanese Laid-open Patent Publication No. 64-69015, Japanese Laid-open Patent Publication No. 2005-166958 and Japanese Laid-open Patent Publication No. 2003-273059.

SUMMARY

It is an aspect of the embodiments discussed herein to provide a substrate processing apparatus including a processing chamber that houses a substrate, a pipe that supplies gas into the processing chamber, and a heating unit that is provided in the middle of the pipe and heats the gas, wherein the heating unit heats the gas to a temperature lower than a temperature at which degas is generated from the inside of the pipe, and the substrate is dried in the heated gas.

DETAILED DESCRIPTION OF THE EMBODIMENTS

Figure 1:
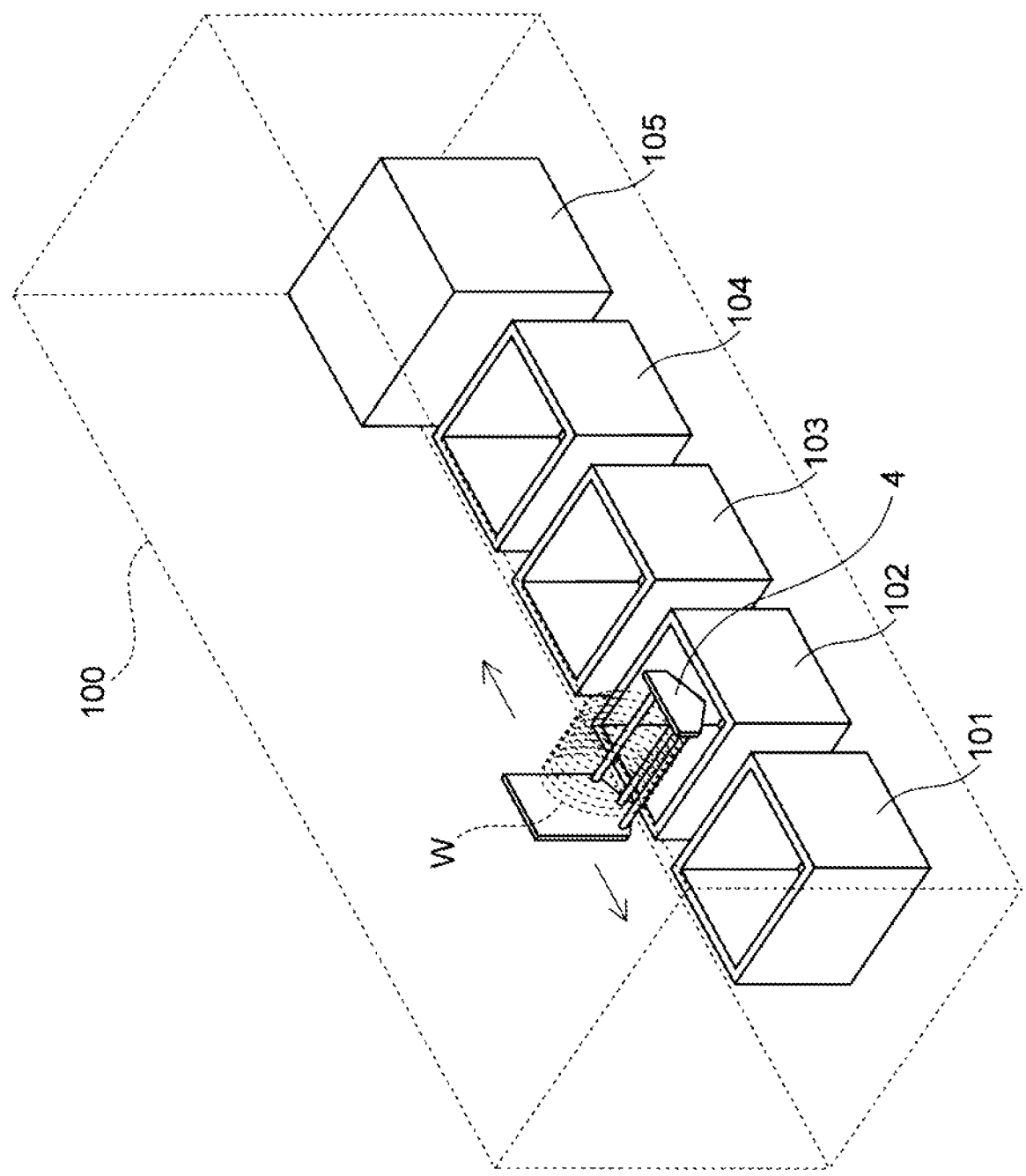
FIG. 1 is a configuration diagram showing a substrate cleaning system used in an embodiment.

FIG. 1 is a configuration diagram showing a substrate cleaning system 100 used in the present embodiment.

This system 100 is a batch system capable of simultaneously processing multiple substrates W, and includes first to fourth processing tanks 101 to 104 storing deionized water or chemical solutions, and a substrate processing apparatus 105 for drying the substrates W. The types of the substrates W are not particularly limited, and it is possible to process, as the substrates W, silicon (semiconductor) substrates for semiconductor devices, or quartz substrates used for liquid crystal display devices and the like.

Moreover, the liquids to be stored in the respective processing tanks 101 to 104 are not particularly limited. In this embodiment, deionized water is stored in the second and fourth processing tanks 102 and 104, for example. Meanwhile, SPM is stored in the first processing tank 101, and APM is stored in the third processing tank 103. Here, the SPM means a mixed solution of sulfuric acid, hydrogen peroxide water, and deionized water (sulfuric acid hydrogen peroxide mixture), and the APM means a mixed solution of ammonia, hydrogen peroxide water, and deionized water (ammonia hydrogen peroxide mixture).

Note that it is also possible to use HPM or buffer hydrofluoric acid, instead of the APM or the SPM. The HPM means a mixed solution of hydrochloric acid, hydrogen peroxide water, and deionized water (hydrochloric acid-hydrogen peroxide mixture).

The multiple substrates W are held by a lifter (a substrate holder) 4. The lifter 4 moves in the directions of arrows in FIG. 1 by use of an unillustrated motor, and conveys the substrates W to the respective processing tanks 101 to 104 in an arbitrary order. Then, the silicon substrates W are eventually housed in the processing apparatus 105 by the lifter 4 in order to dry the substrates W.

Figure 2:
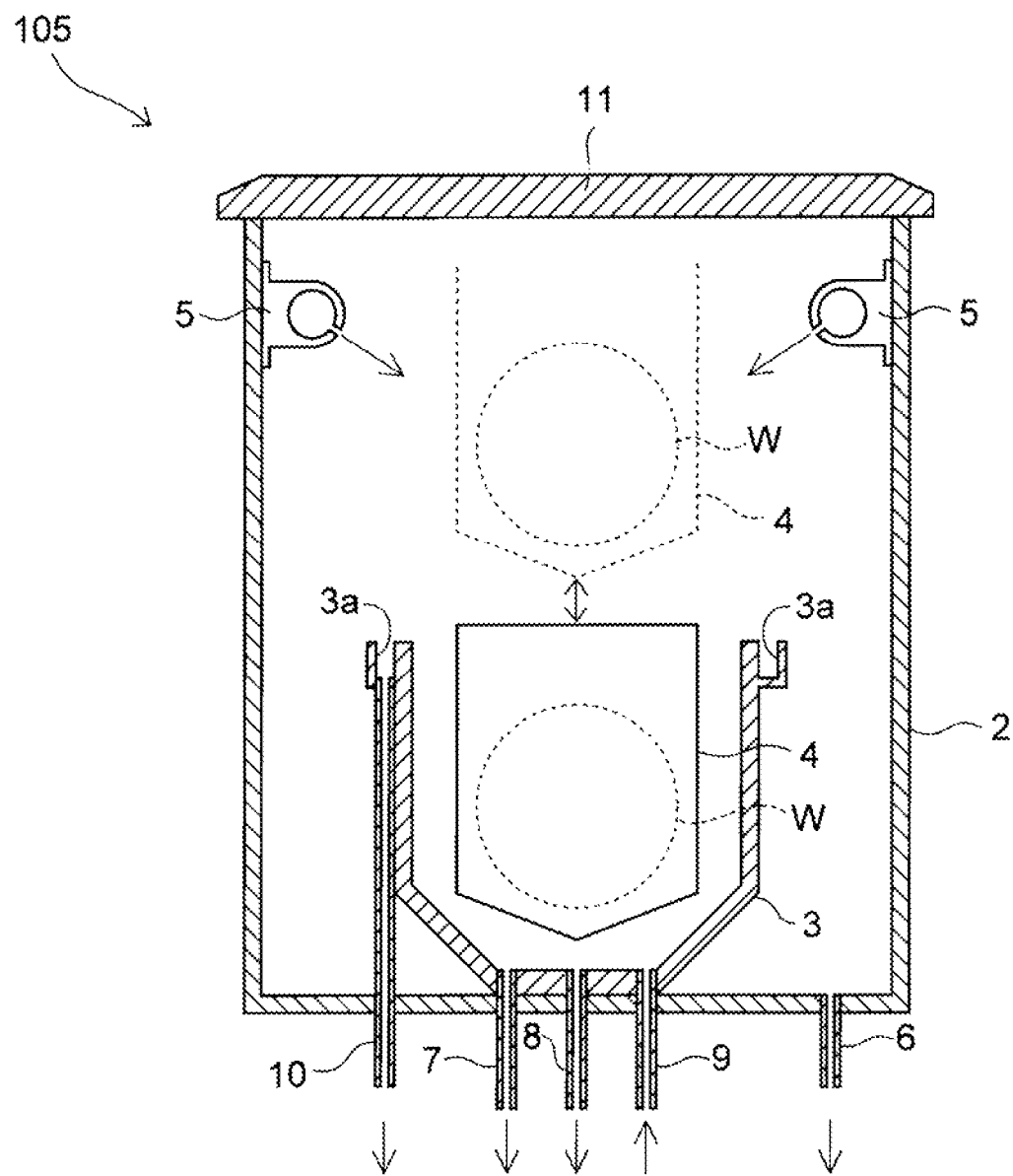
FIG. 2 is a configuration diagram showing a substrate processing apparatus according to the embodiment.

FIG. 2 is a configuration diagram showing the substrate processing apparatus 105.

This substrate processing apparatus 105 has a function to dry the substrates W, and includes a processing chamber 2 and a liquid tank 3. The liquid tank 3 can store water, chemical solutions, and the like. A pipe 9 for supplying these liquids, a pipe 8 for draining the liquids, and a pipe 7 for returning the liquids are connected to the liquid tank 3 as illustrated in FIG. 2.

Moreover, a groove 3a is formed on an upper end of the liquid tank 3 so that the liquid spilling out of the liquid tank 3 is collected by use of the groove 3a and a pipe 10.

Further, a horizontally movable shutter 11 is provided above the processing chamber 2. The processing chamber 2 is hermetically sealed when this shutter 11 is closed.

Meanwhile, the hermetically sealed state inside the processing chamber 2 is interrupted by opening the shutter 11 before and after the processing in the processing chamber 2, so that the above-described lifter 4 can go in and out of the processing chamber 2. The lifter 4 is capable of moving vertically in the processing chamber 2. With this movement of the lifter 4, the substrates W can be put into the liquid tank 3 and pulled out of the liquid tank 3.

A space above the liquid tank 3 is used for drying the substrates W in a vaporized organic solvent atmosphere such as IPA (isopropyl alcohol) gas, or in an inert gas such as a nitrogen gas. For supplying these gases, a gas supply port 5 is provided on an upper part of the processing chamber 2. Moreover, in order to accelerate a drying rate by reducing pressure in the processing chamber 2, an exhaust port 6 connected to an unillustrated vacuum pump is provided at a lower part of the processing chamber 2.

Figure 3:
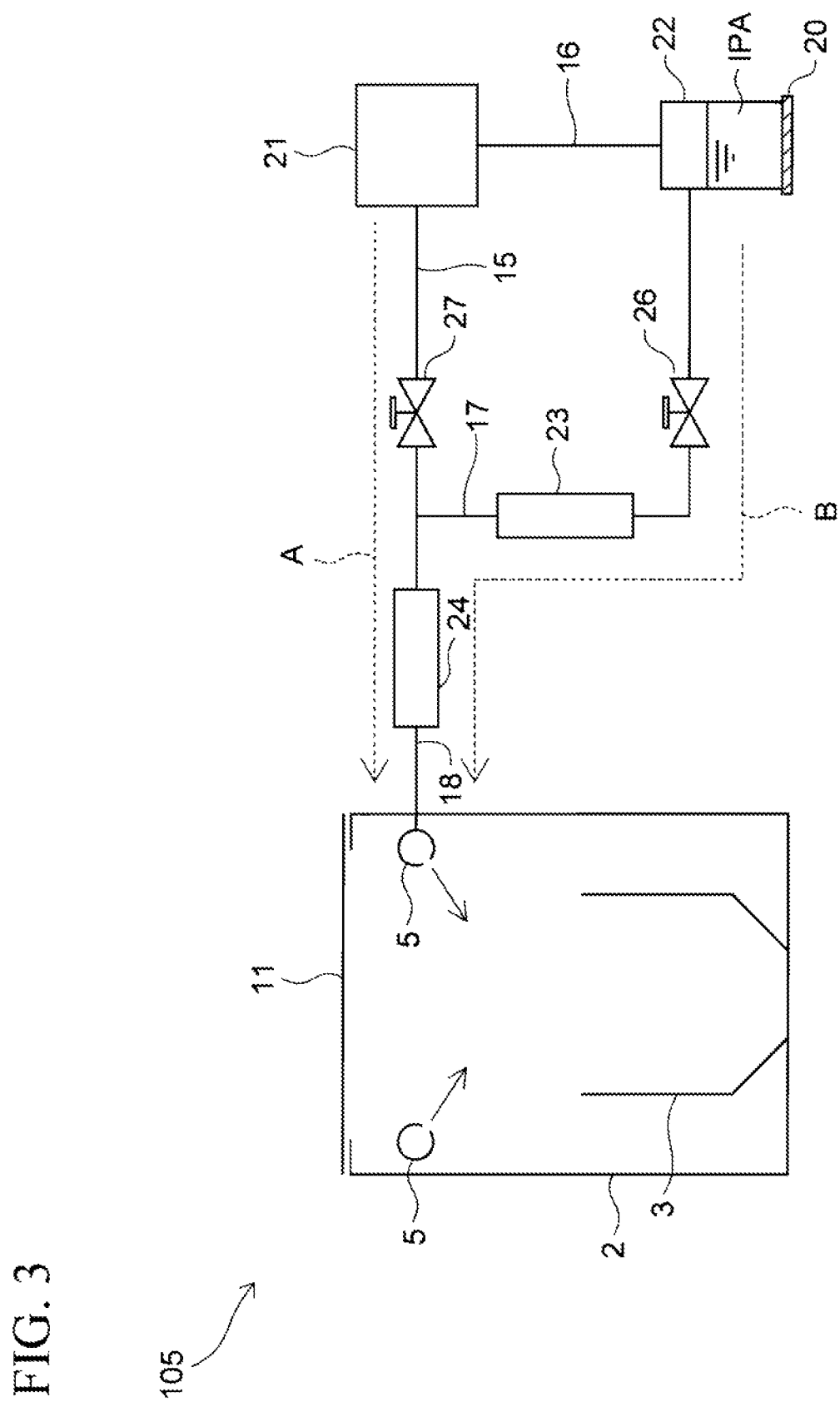
FIG. 3 is a schematic diagram showing a gas supply mechanism for the substrate processing apparatus according to the embodiment.

FIG. 3 is a schematic diagram showing a gas supply mechanism for this substrate processing apparatus 105.

As shown in FIG. 3, the substrate processing apparatus 105 includes first to four gas pipes 15 to 18. Among them, a nitrogen supply source 21 such as a nitrogen gas cylinder is connected to the starting end of the first pipe 15, so that nitrogen gas supplied from this nitrogen supply source 21 is supplied to the processing chamber 2 through the first pipe 15 and the fourth pipe 18.

Meanwhile, the second gas pipe 16 is also connected to the nitrogen supply source 21, and an IPA container 22 is provided on the end of this second gas pipe 16.

IPA is stored in the IPA container 22. The IPA is vaporized by heating the IPA with an IPA heater 20 provided below the container 22. The vaporized IPA passes through the third gas pipe 17 and the fourth gas pipe 18, and is then supplied to the processing chamber 2 together with the nitrogen gas having passed through the second gas pipe 16.

Here, the concentration of the IPA gas in the mixed gas of the IPA gas and the nitrogen gas can be controlled by the temperature of the IPA heater 20. For example, more IPA is vaporized and the concentration of the IPA is increased by raising the temperature of the IPA heater 20. On the contrary, the concentration is reduced by lowering the temperature of the IPA heater 20.

Switching between the nitrogen gas and the IPA gas is executed by use of first and second valves 26 and 27. When supplying only the nitrogen gas to the processing chamber 2, the first valve 26 is closed and the second valve 27 is opened, to supply the nitrogen gas by way of a passage A shown in FIG. 3. On the contrary, when supplying the IPA gas, the first valve 26 is opened and the second valve 27 is closed, to supply the IPA gas by way of a passage B.

Moreover, first and second heaters (heating units) 23 and 24 are provided in the middle of the third gas pipe 17 and the fourth gas pipe 18, respectively.

In the case of supplying only the nitrogen gas to the processing chamber 2, the nitrogen gas passing through the passage A is heated by the second heater 24. On the contrary, in the case of supplying the IPA gas to the processing chamber 2, the IPA gas passing through the passage B is heated by both the first and second heaters 23 and 24.

Here, it is preferable to use a flexible material for the material of the respective gas pipes 15 to 18 so that the respective gas pipes 15 to 18 can be arranged easily in a small space in the system. As such a material, in this embodiment, fluororesin having excellent chemical resistance such as PTFE (polytetrafluoroethylene) or PFA (perfluoroalcoxy) is used.

Next, a substrate processing method using the substrate processing apparatus 105 will be described below.

FIGS. 4A to 4H are schematic diagrams for explaining this substrate processing method.

This example is effective for a wet process in a manufacturing process of a semiconductor device using silicon substrates as the substrates W, where the wet process is carried out for removing resist residues after a resist pattern is removed by asking.

In this wet process, the substrates W are firstly cleaned in the first to fourth processing tanks 101 to 104 of the substrate cleaning system 100 shown in FIG. 1.

Subsequently, the substrates W are dried in accordance with the following procedures.

Figure 4A:
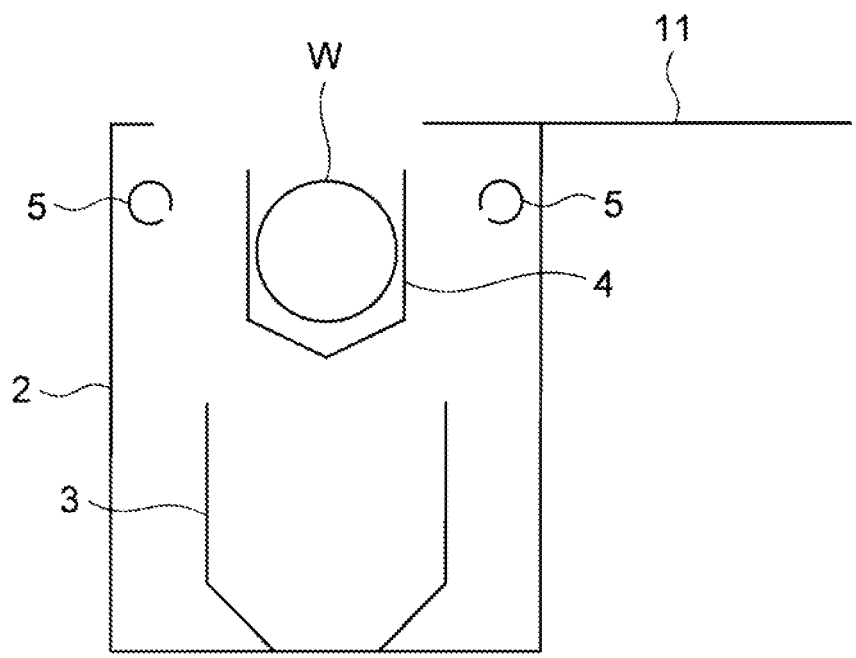
FIGS. 4A to 4H are schematic diagrams for explaining a substrate processing method according to the embodiment.

Firstly, as shown in FIG. 4A, the shutter 11 is opened for putting the substrates W into the processing chamber 2, and then the shutter 11 is closed to hermetically seal the processing chamber 2.

Figure 4B:
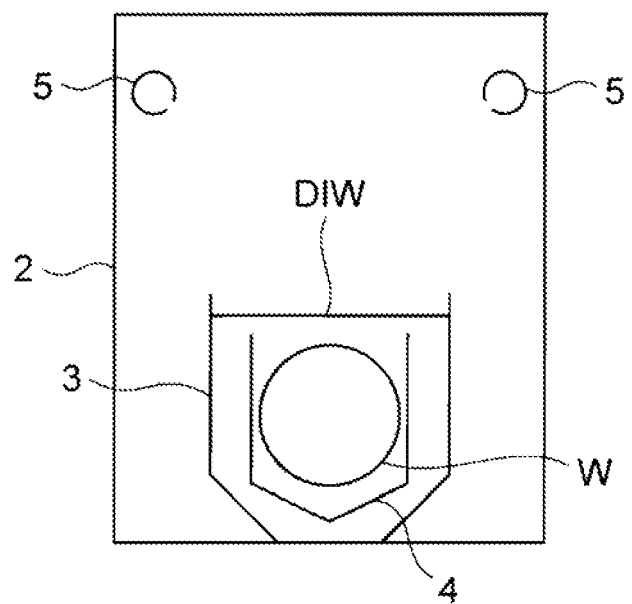

Subsequently, as shown in FIG. 4B, the DIW (deionized water) is supplied from the pipe 9 (see FIG. 2) to the liquid tank 3 so as to fill the liquid tank 3 with the deionized water. Then, the substrates W are dipped in the deionized water by descending the lifter 4, and thereby, the liquids attached to surfaces of the substrates W during the processes in the first to fourth processing tanks 101 to 104 are removed with the deionized water. This process is also called a rinsing process.

Figure 4C:
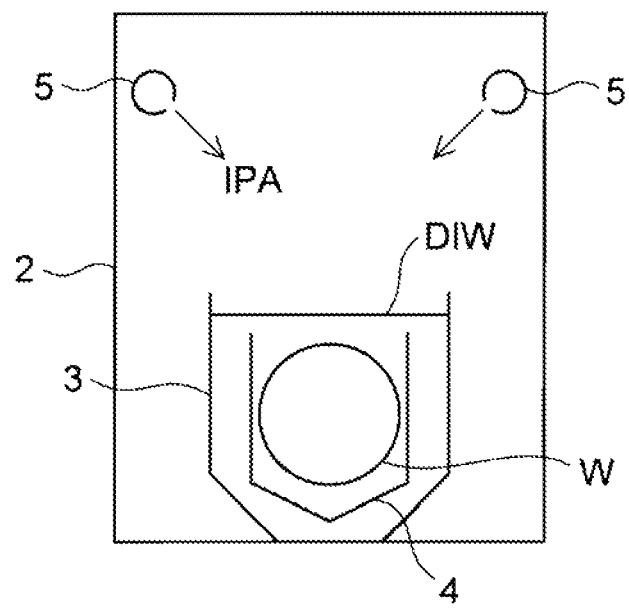

Next, as shown in FIG. 4C, the IPA gas is supplied from the gas supply port 5 to the processing chamber 2 to fill the processing chamber 2 with an IPA atmosphere.

Here, the IPA gas is heated by the first and second heaters 23 and 24 as described in FIG. 3. The heating temperature is around 90° C. immediately after being supplied from the gas supply port 5, for example.

Figure 4D:
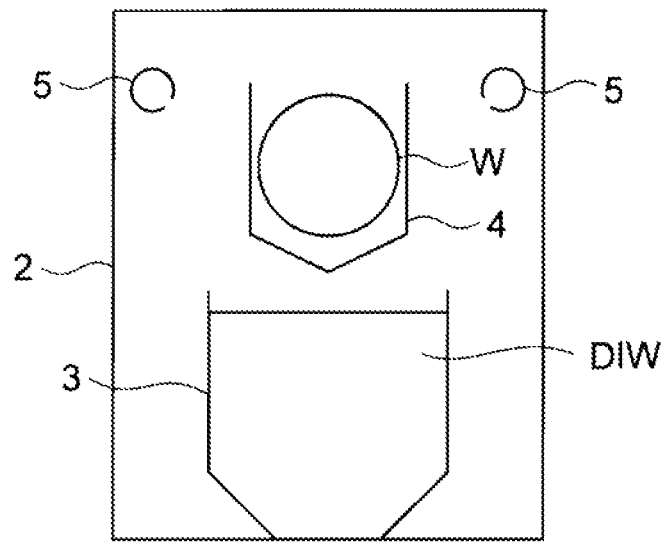

Subsequently, as shown in FIG. 4D, the silicon substrates W are pulled up from the liquid tank 3 by use of the lifter 4. In this way, the silicon substrates W are exposed to the IPA gas atmosphere, and consequently, water droplets attached to the surfaces of the substrates W are replaced with the IPA. Since the vapor pressure of the IPA is higher than that of the deionized water, the surfaces of the substrates W can be dried up more quickly.

In addition, since the IPA gas is heated by the first and second heaters 23 and 24 as described previously, the substrates W are also heated and thus dried up more quickly, and the water droplets on the surfaces of the substrates W are more easily replaced with the IPA.

Figure 4E:
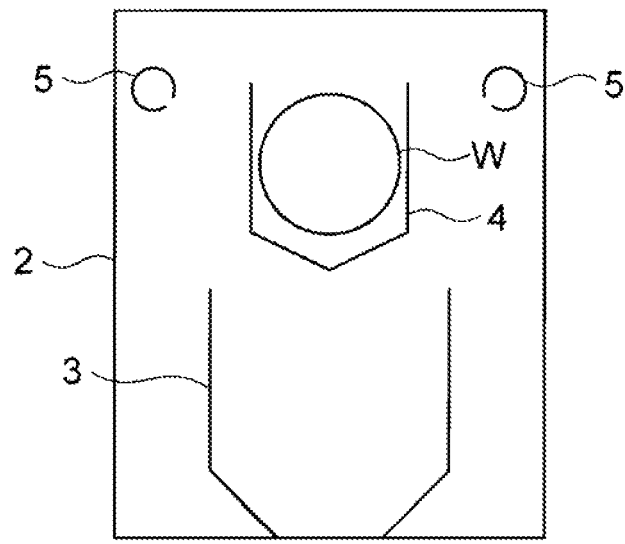

Subsequently, as shown in FIG. 4E, the IPA gas supply is stopped, and then the deionized water in the liquid tank 3 is expelled from the pipe 8 (see FIG. 2) to the outside, so that the liquid tank 3 becomes empty.

Figure 4F:
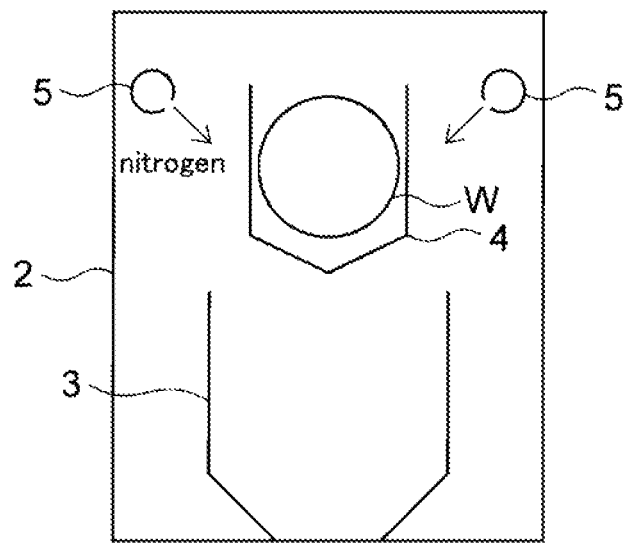

Next, as shown in FIG. 4F, the nitrogen gas is supplied from the gas supply port 5 to the processing chamber 2 so as to replace the atmosphere of the IPA in the processing chamber 2 by the nitrogen.

Here, the nitrogen gas is heated by the second heater 24 as described in FIG. 3. The nitrogen temperature is around 90° C. immediately after being supplied from the gas supply port 5, for example.

The heated state of the substrates W is maintained by exposing the substrates W to the heated nitrogen gas in this manner.

Figure 4G:
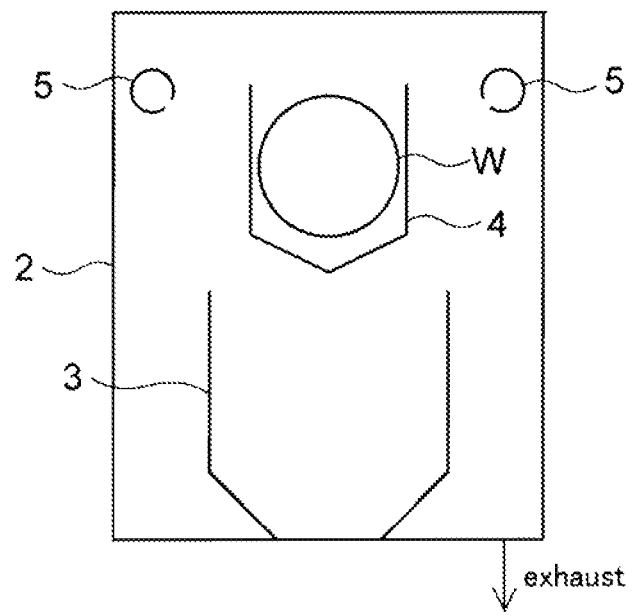

Next, as shown in FIG. 4G, the nitrogen gas supply is stopped, and then the nitrogen gas is exhausted from the outlet port 6 (see FIG. 2) to reduce the pressure in the processing chamber 2. By reducing the pressure in this manner, the IPA condensed on the surfaces of the substrates W is vaporized, so that the surfaces of the substrates W are dried up efficiently.

Figure 4H:
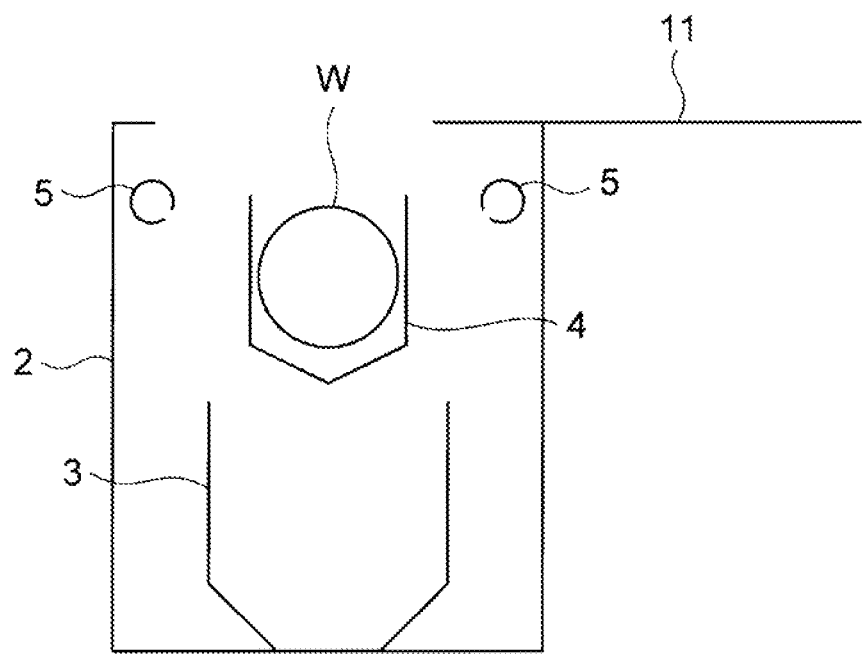

Lastly, as shown in FIG. 4H, the processing chamber 2 is set open to the air by opening the shutter 11, and then, the substrates W are taken out of the processing chamber 2.

In this way, the principal steps of the substrate process are completed.

Although the deionized water is collected in the liquid tank 3, it is also possible to use other chemical solutions such as APM, SPM, HPM, a buffer hydrofluoric acid solution, and the like, instead of the deionized water.

Heating the gas in the step (FIG. 4C) of introducing the IPA gas and in the step (FIG. 4F) of introducing the nitrogen gas when the silicon substrates W are dried in the substrate processing apparatus 105 is effective for increasing drying efficiency and preventing dew condensation on the silicon substrates W.

The gas temperature that can prevent dew condensation is expected to be equal to or above 125° C.

It is to be noted, however, that such a dew condensation prevention of the IPA is premised on that the dew point of the IPA is equal to or above room temperature (20° C.). For this reason, if the dew point of the IPA is below room temperature as in the case of a low concentration of the IPA gas, the IPA is not condensed on the substrates W even when the IPA gas is not heated.

Rather, the results of the investigation conducted by the inventor of the present application show that the reliability of the semiconductor device is reduced, and product yield thereof is deteriorated, when the gas temperature is set to be high. The details are as follows.

Figure 5A:
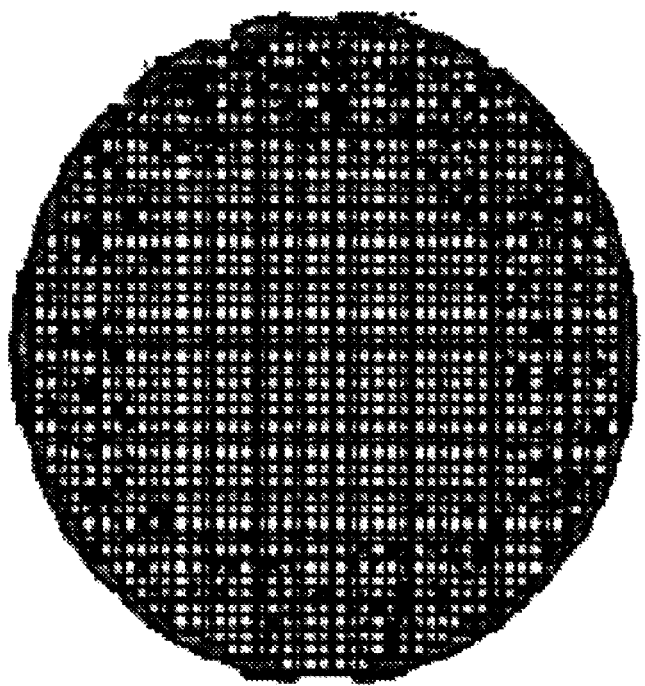
FIGS. 5A and 5B are wafer maps obtained by investigating photoresist defects by using a defect inspection apparatus.
Figure 5B:
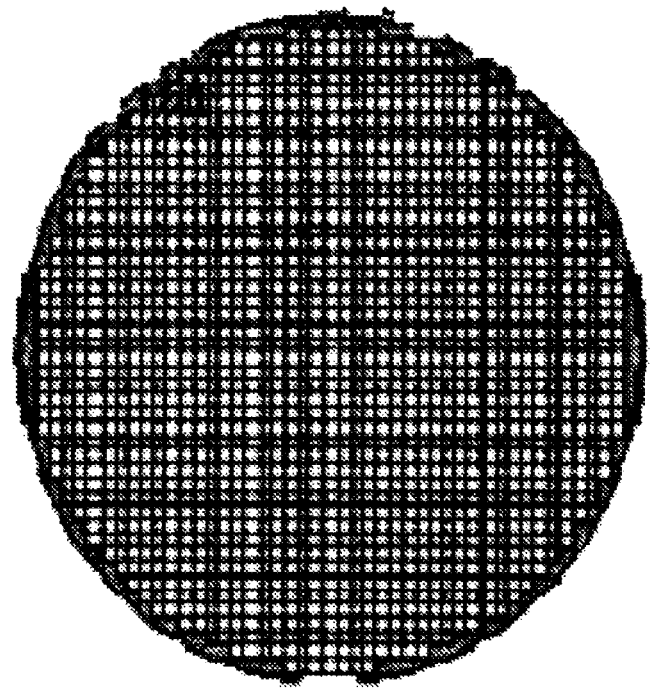

FIGS. 5A and 5B are wafer maps obtained by subjecting a 300-mm silicon wafer (the substrates W) to the steps described in FIGS. 4A to 4H, then coating photoresist on the silicon wafer, and then investigating photoresist defects by use of a defect inspection apparatus.

Of these wafer maps, FIG. 5A is the wafer map obtained in the case of heating the nitrogen gas to 120° C. in the step shown in FIG. 4F. Meanwhile, FIG. 5B is the wafer map obtained in the case of heating the nitrogen gas to 90° C. in this step. Here, the temperature of the nitrogen gas is obtained by measuring the nitrogen gas immediately after being supplied from the gas supply port 5 with a thermometer. The gas temperature hereinafter in this specification is defined as the temperature of the gas immediately after being supplied from the gas supply port 5 in this manner.

As shown in FIG. 5A, when the temperature of the nitrogen gas is set to be 120° C., defects are generated over a broad range on the wafer W. These defects are assumed to be minute holes (micro bubbles) formed in a photoresist film.

Formation of these defects in the photoresist leads to a problem of unnecessary ion implantation in a region, on the silicon wafer, unexpected for ion implantation if the photoresist is used as a mask for such ion implantation. Meanwhile, formation of these defects in the photoresist leads to a problem of deviation in the shape of an etched film from a designed shape if the photoresist is used as a mask for etching.

By contrast, as shown in FIG. 5B where the temperature of the nitrogen gas is set to be 90° C., defects generated in the photoresist are significantly reduced.

From these investigation results, it is apparent that the photoresist defects are more prominent than the effect of dew condensation prevention on the silicon wafer, when the temperature of the nitrogen gas is set to an unnecessarily high temperature, for example, equal to or above 120° C., so that the yield of the semiconductor devices is reduced.

In order to investigate the cause for generation of the defects in the photoresist as described above, the inventor of the present application carried out the steps shown in FIGS. 4A to 4H on a 300-mm silicon wafer, and then measured, by using a gas chromatograph-mass spectrometry (GC-MS), degas generated from the silicon wafer due to an organic materials. Note that no photoresist was coated on the silicon wafer when this measurement was carried out. Moreover, in this measurement, the temperature of the nitrogen gas is variously changed in the step shown in FIG. 4F in order to investigate the temperature dependency of the organic materials.

Figure 6:
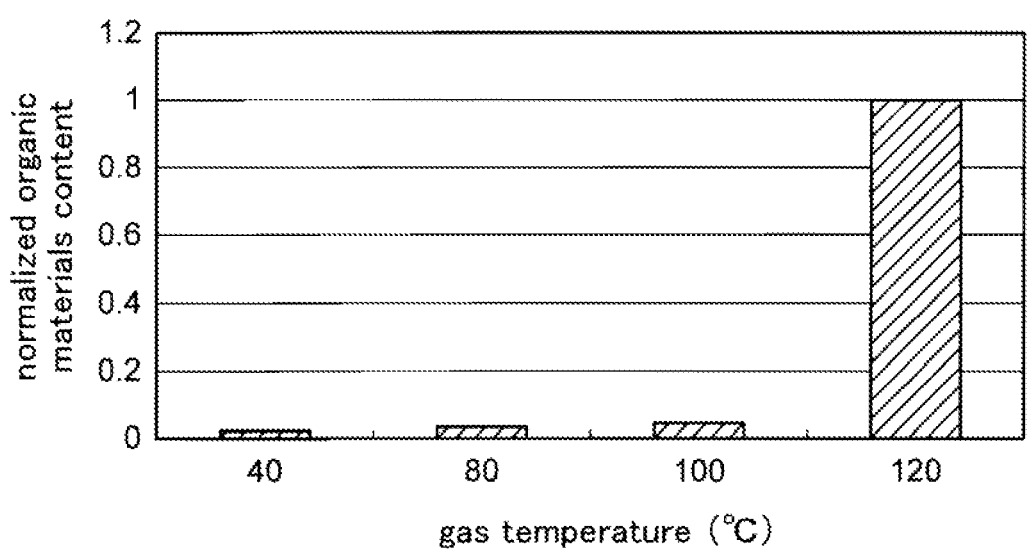
FIG. 6 is a graph obtained by investigating relations between the temperature of nitrogen gas and the organic materials content.

FIG. 6 shows the result of this measurement.

The horizontal axis in FIG. 6 indicates the temperature of the nitrogen gas while the vertical axis therein indicates normalized organic materials content.

As shown in FIG. 6, the organic materials content is quite small when the temperature of the nitrogen gas ranges from 40° C. to 100° C.

On the contrary, the organic materials content is suddenly increased when the temperature of the nitrogen gas reaches 120° C.

By combining this result and the above-described results in FIGS. 5A and 5B, the organic materials adhered to the surfaces of the silicon wafer are attributed to the generation of the numerous defects in the photoresist in the case of setting the temperature of the nitrogen gas to 120° C. This is because adhesion between the silicon wafer and the photoresist is degraded when the organic materials are adhered to the surface of the silicon wafer, whereby the above-mentioned micro bubbles are generated in the photoresist.

Experiments were repeated by replacing various parts in the processing chamber 2 in order to specify the generation source of the organic materials. However, no improvement of the defects was observed. Accordingly, the experiments showed that the generation source of the organic materials resides outside the processing chamber 2, i.e. in the fourth gas pipe 18.

As described previously, the fourth gas pipe 18 is made of fluororesin. Hence, it is conceivable that organic degas (i.e., degassing of organic materials) is generated from an inner wall of the fourth gas pipe 18 with the increase in the temperature of the nitrogen gas, and thereby, the organic materials adhered to the silicon wafer are increased.

As described above, from the viewpoint of improving the reliability of the semiconductor device by reducing the content of organic materials adhered to the silicon wafer during the process, it is necessary to heat the nitrogen gas to a temperature lower than the temperature at which degas from the fourth gas pipe 18 is generated, in the step of drying the silicon wafer. Such a temperature is equal to or below 100° C. according to FIG. 6.

Moreover, by setting the temperature of the nitrogen gas equal to or below 100° C., which is equal to or below the boiling point of water, the moisture remaining in the liquid tank 3 and the like in the processing chamber 2 is not vaporized in the course of drying the silicon wafer. Accordingly, it is possible to prevent the moisture remaining in the processing chamber from being vaporized and condensed on the silicon wafer W. Thus, since no particles associated with the condensed moisture remain on the silicon wafer W after drying, it is possible to further improve the reliability of the semiconductor devices.

Here, the above-described investigation results concern the nitrogen gas. However, similar tendencies as those described with reference to FIGS. 5A and 5B and FIG. 6 are also observed in the case of introducing the IPA gas in the step shown in FIG. 4C. Thus, it is also necessary to heat the IPA gas to a temperature lower than the temperature, i.e. equal to or below 100° C., at which degas is generated from the third and fourth gas pipes 17 and 18 where the heated IPA gas passes through, upon introduction to the processing chamber 2.

Even when the IPA gas is set at a low temperature in this manner, dew condensation of the IPA on the surfaces of the wafer is prevented as long as the temperature of the IPA gas is kept equal to or above room temperature, under the conditions that the concentration of the IPA gas is low and hence the dew point of the IPA is lower than room temperature.

In the case when high drying efficiency is required, for example, a case where there are large unevenness on a surface of a wafer so that water droplets are apt to remain on the substrate, the concentration of the IPA gas is usually increased to make it easier to replace the moisture remaining on the wafer with the IPA.

However, in this embodiment, the concentration of the IPA gas is adjusted to such a concentration that the dew point of the IPA be below room temperature as described previously, in order to give priority to dew condensation prevention over drying efficiency. Such adjustment can be made by controlling the setting temperature of the above-described IPA heater 20.

Next, a method of manufacturing a semiconductor device based on the above investigation results will be described.

FIGS. 7A to 7J are cross-sectional views in the course of manufacturing a semiconductor device according to the embodiment of the present embodiment.

Figure 7A:
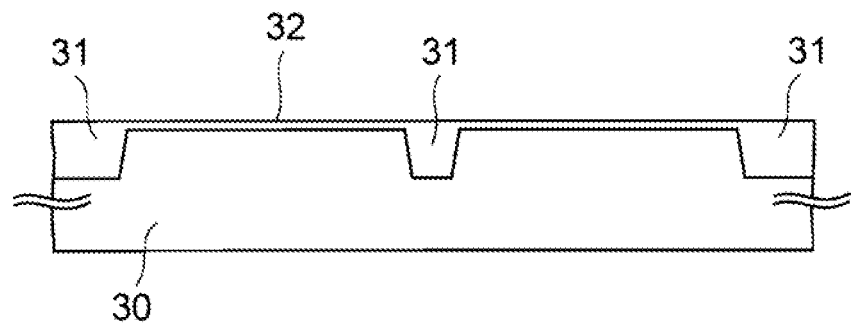
FIGS. 7A to 7J are cross-sectional views in the course of manufacturing a semiconductor device according to the embodiment.

Firstly, as shown in FIG. 7A, shallow trench isolation (STI) grooves for defining active regions of transistors are formed on a surface of a silicon substrate 30 either of an n-type or a p-type, and an insulating film, such as silicon oxide, is buried therein to form element isolation insulating films 31. Here, the element isolation structure is not limited only to the STI, and it is also possible to form the element isolation insulating films 31 in accordance with the local oxidation of silicon (LOCOS) method.

Further, a thermal oxidation film is formed with a thickness of about 10 nm as a sacrificial insulating film 32 by subjecting the surface of the silicon substrate 30 to thermal oxidation.

Figure 7B:
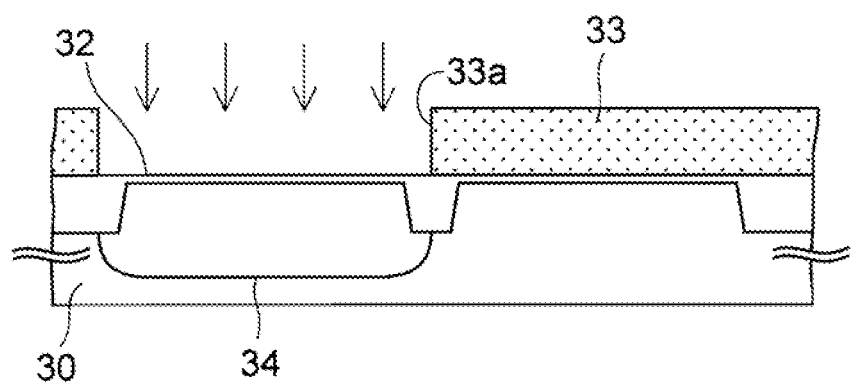

Subsequently, a first resist pattern 33 is formed on the sacrificial insulating film 32 as shown in FIG. 7B.

Then, a p-type impurity is ion-implanted to the silicon substrate 30 through a window 33*a* of the first resist pattern 33 while the sacrificial insulating film 32 is used as a through film, so as to form a p-well 34.

Figure 7C:
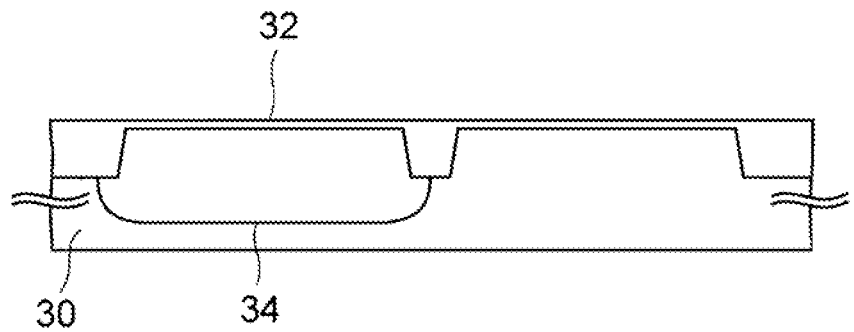

Thereafter, the first resist pattern 33 is removed as shown in FIG. 7C. This process is carried out as follows.

Firstly, a major part of the first resist pattern 33 is changed into ash and removed by ashing, in which the silicon substrate 30 is heated in a mixed atmosphere of nitrogen and oxygen.

Subsequently, the silicon substrate is subjected to the wet process in the substrate cleaning system 100 described in FIG. 1, in order to remove the first resist pattern 33 remaining even after the ashing process.

This wet process is broadly categorized into cleaning steps performed in the first to fourth processing tanks 101 to 104 and a drying step (a first drying step) performed in the substrate processing apparatus 105.

Of these steps, the cleaning step includes cleaning with SPM in the first liquid tank 101, rinsing with deionized water in the second liquid tank 102, cleaning with APM in the third liquid tank 103, and rinsing with deionized water in the fourth liquid tank 104, by dipping the silicon substrate 30 sequentially in the respective liquid tanks 101 to 104. Moreover, the cleaning with the deionized water described with reference to FIGS. 4A and 4B is also included in this cleaning step.

Then, in the drying step, the moisture remaining on the surface of the silicon substrate 30 is dried in accordance with the above-described steps shown in FIGS. 4C to 4H.

Here, in the step of introducing the isopropyl alcohol gas in FIG. 4C and the step of introducing the nitrogen gas in FIG. 4F, the heating temperature of the gas is set to the temperature lower than such a temperature that the third and fourth gas pipes 17 and (see FIG. 3) would generate the degas, i.e. the temperature equal to or below 100° C. In this way, it is possible to suppress generation of the degas containing the organic materials emitted from the gas pipes 17 and 18 made of the fluororesin, and to prevent adhesion of the organic materials to the sacrificial insulating film 32 after drying.

Figure 7D:
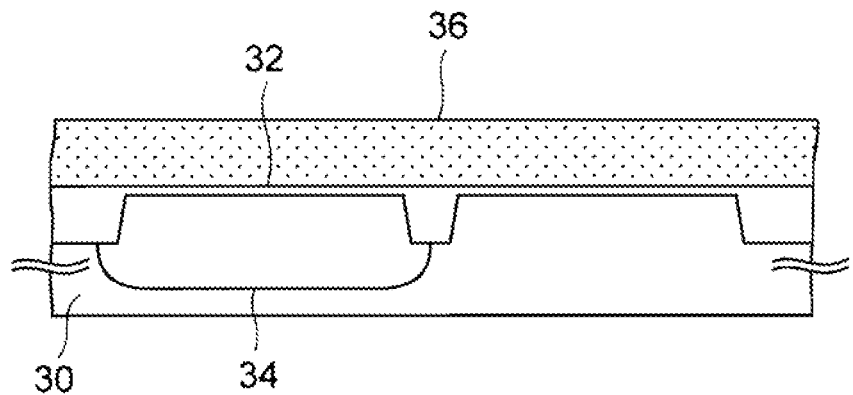

Next, as shown in FIG. 7D, photoresist 36 is coated onto the sacrificial insulating film 32, and then the silicon substrate 30 is subjected to a thermal treatment to vaporize a solvent component in the photoresist 36. Such a thermal treatment is also called baking.

As described previously, the organic materials remaining on the sacrificial insulating film 32 are reduced after the cleaning process shown in FIG. 7C. Accordingly, this photoresist 36 has good adhesion to the sacrificial insulating film 32. Hence, defects, such as micro bubbles, are hardly generated in the photoresist.

Figure 7E:
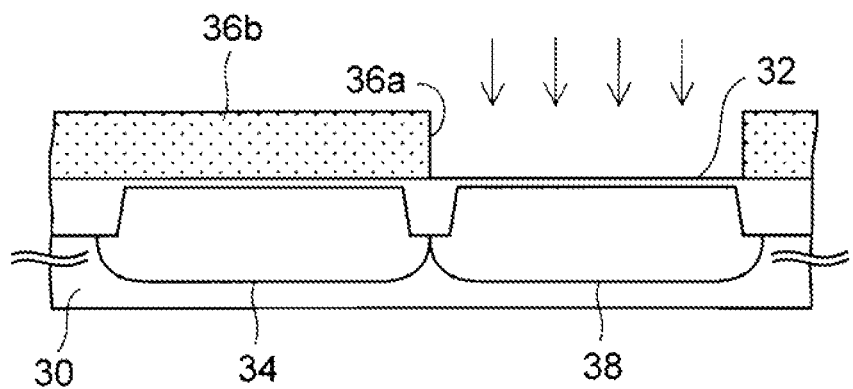

Subsequently, as shown in FIG. 7E, a second resist pattern 36*b* including a window 36*a* is formed by developing the photoresist 36. Since the photoresist 36 includes very few defects as described above, it is possible to form the fine second resist pattern 36*b* without shape anomalies or locally thin portions.

Then, an n-well 38 is formed in the silicon substrate 30 beside the p-well 34 by implanting ions of an n-type impurity into the silicon substrate 30 through the window 36*a* while the sacrificial insulating film 32 is used as a through film. Since the second resist pattern 36*b* is fine as described above, it is possible to form the n-well 38 having a planar shape as designed, and to prevent implantation of the n-type impurity into a region of the silicon substrate 30 outside the n-well 38.

Figure 7F:
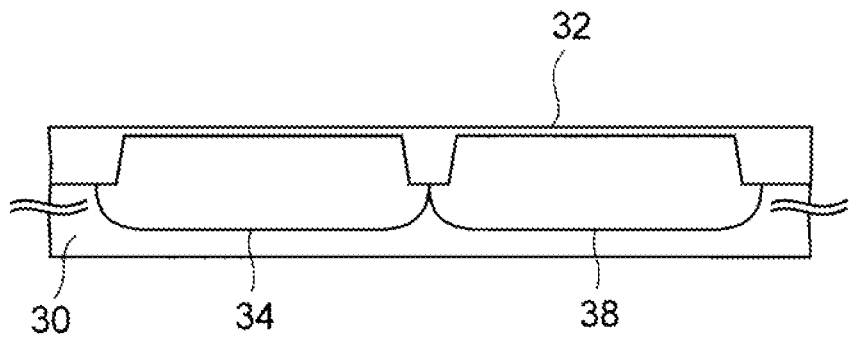

Next, the second resist pattern 36*b* is removed as shown in FIG. 7F by executing the same step as the step illustrated in FIG. 7C.

Figure 7G:
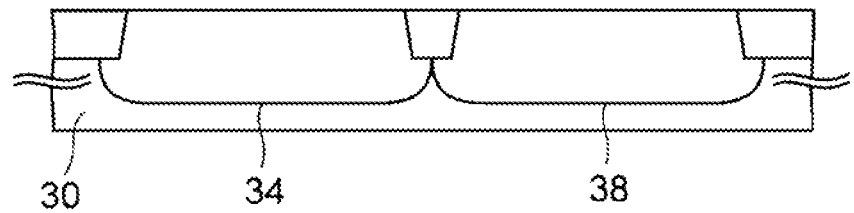

Subsequently, as shown in FIG. 7G, the sacrificial insulating film 32 damaged by the respective ion implantation processes is removed by wet etching using a hydrofluoric acid solution so as to expose a cleaning surface of the silicon substrate 30.

Thereafter, the cleaning surface of the silicon substrate 30 is subjected to the wet process by use of the cleaning system 100 shown in FIG. 1. This wet process is essentially the same as the combination of the cleaning step and the drying step described with reference to FIG. 7C. In the cleaning step, it is also possible to add a step of dipping the silicon substrate 30 into a buffer hydrofluoric acid solution in order to remove a natural oxide film on the surface of the silicon substrate 30.

Moreover, in the drying step (a second drying step), the heating temperature of the gas is set equal to or below 100° C., which is the temperature lower than such a temperature that the third and fourth gas pipes 17 and (see FIG. 3) would generate the degas, so as to suppress generation of the degas containing the organic materials from these gas pipes 17 and 18, and to prevent adhesion of the organic materials to the surface of the silicon substrate 30.

Figure 7H:
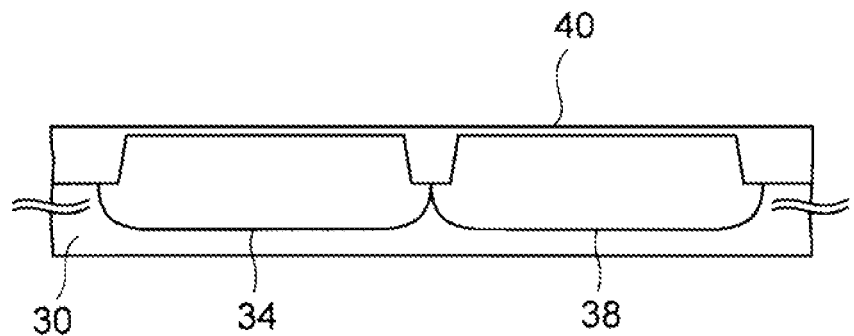

Subsequently, as shown in FIG. 7H, a thermal oxidation film is formed with a thickness of about 10 nm as a gate insulating film 40 by subjecting the surface of the silicon substrate 30 to thermal oxidation.

Here, since no organic matters are adhered to the silicon substrate 30 in the cleaning step in FIG. 7G, it is possible to avoid generation of pinholes and the like in the gate insulating film 40 at the time of its growth, and thereby to prevent deterioration in withstand voltage of the gate insulating film 40.

Figure 7I:
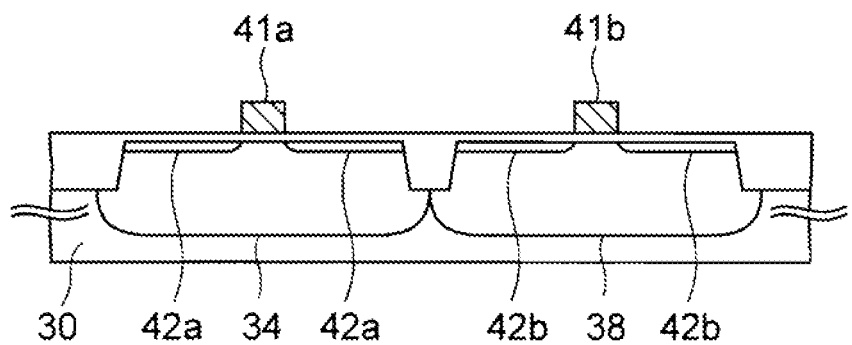

Next, the process for obtaining a cross-sectional structure shown in FIG. 7I will be described.

First, a polysilicon film is formed on the gate insulating film 40 by the CVD method, and this polysilicon film is patterned into gate electrodes 41a and 41b.

Then, ions of an n-type impurity are implanted into the p well 34 beside the gate electrode 41a while these gate electrodes 41 are used as a mask to form an n-type source/drain extension 42a. Similarly, ions of a p-type impurity are implanted into the n well 38 beside the gate electrode 41b to form a p-type source/drain extension 42b.

Note that the ions of the n-type impurity and the ions of the p-type impurity are separately implanted by using unillustrated resist patterns.

Figure 7J:
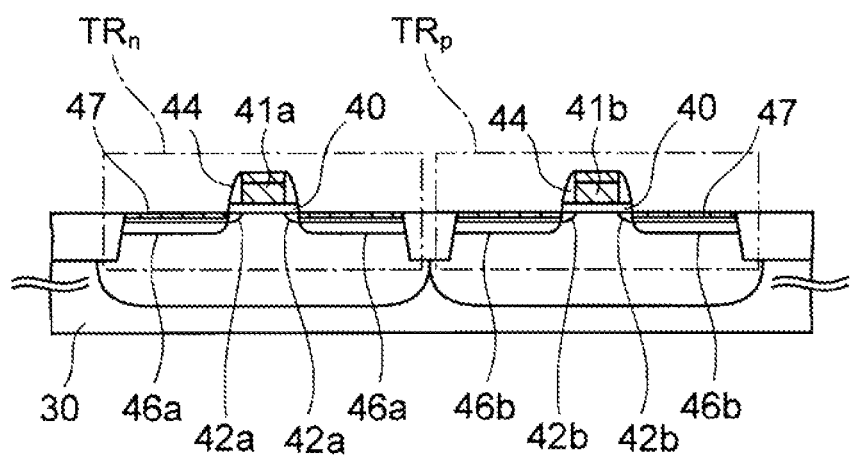

Subsequently, as shown in FIG. 7J, an insulating film such as a silicon oxide film is formed on the entire upper surface of the silicon substrate 30, and insulating side walls 44 are left beside the gate electrodes 41a and 41b by etching back the insulating film.

Then, n-type source-drain regions 46a and p-type source-drain regions 46b are formed in the silicon substrate 30 beside these gate electrodes 41a and 41b by means of ion implantation while the respective gate electrodes 41a and 41b are used as a mask.

Next, a refractory metal layer such as a cobalt layer is formed on the entire upper surface of the silicon substrate 30 by the sputtering method. Then, this refractory metal layer is heated to cause a reaction with silicon, thereby forming a refractory metal silicide layer 47 on the silicon substrate 30. The refractory metal silicide layer 47 is also formed on top layer portions of the gate electrodes 41a and 41b, thereby reducing resistance of the gate electrodes 41a and 41b.

Thereafter, the unreacted refractory metal layer on the element isolation insulating films 31 and the like is removed by wet etching.

In this way, basic structures of an n-type MOS transistor $TR_n$ and a p-type MOS transistor $TR_p$, which are of the CMOS structure, are completed on the active region of the silicon substrate 30.

Then, processes for forming interlayer insulating films covering the respective transistors $TR_n$ and $TR_p$ and for forming metal wiring are performed. However, details of these processes will be omitted herein.

According to the above-described embodiment, the silicon substrate 30 is dried in the step of removing the residues of the first resist pattern 33 in the FIG. 7C and in the wet process of the silicon substrate 30 in FIG. 7G by use of the substrate processing apparatus 105.

In these drying steps, the heating temperature of the gas is set equal to or below 100° C., which is the lower temperature than the temperature for generating the degas from the third and fourth gas pipes 17 and 18 (see FIG. 3). Hence, few organic materials generate from these gas pipes 17 and 18 adhered to the silicon substrate 30. In this way, it is possible to prevent organic contamination in the silicon substrate 30, and to suppress defects of the semiconductor device associated with organic contamination, thereby to improve reliability and yield of the semiconductor device.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method of manufacturing a semiconductor device comprising:
   performing a first cleaning of a semiconductor substrate;
   performing a first drying of the semiconductor substrate after performing the first cleaning;
   forming a resist pattern on the semiconductor substrate after performing the first drying;
   forming a well in the semiconductor substrate by implanting ions of an impurity into the semiconductor substrate by using the resist pattern as a mask;
   removing the resist pattern;
   performing a second cleaning of the semiconductor substrate after removing the resist pattern;
   performing a second drying of the semiconductor substrate after performing the second cleaning; and
   forming a gate insulating film on the semiconductor substrate after performing the second drying,
   wherein at least any of the first drying and the second drying are performed by supplying a gas set to have a concentration in which a dew point of organic solvent becomes lower than 20° C. in a pipe made of resin, allowing the gas to pass through the pipe while heating the gas at a temperature equal to or above 20° C. and lower than 100° C. at which degas is generated from the pipe, and then, supplying the heated gas from the pipe, and exposing the semiconductor substrate to the heated gas to dry the semiconductor substrate.

2. The method of manufacturing a semiconductor device according to claim 1, wherein
   the first cleaning and the second cleaning are performed by dipping the semiconductor substrate into a liquid to clean the semiconductor substrate, and the first cleaning and the second cleaning are performed in a processing apparatus.

3. The method of manufacturing a semiconductor device according to claim 2, wherein
   at least any of the first drying and the second drying are performed by supplying a gas containing the organic solvent which is vaporized from the pipe into an atmosphere of the processing apparatus and then replacing the atmosphere with an inert gas by supplying the inert gas from the pipe into the atmosphere.

* * * * *